(12) United States Patent
Shih et al.

(10) Patent No.: US 6,207,482 B1
(45) Date of Patent: Mar. 27, 2001

(54) INTEGRATION METHOD FOR DEEP SUB-MICRON DUAL GATE TRANSISTOR DESIGN

(75) Inventors: Jiaw-Ren Shih; Shui-Hung Chen; Jian-Hsing Lee; Chia-Hung Tunga, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/346,528

(22) Filed: Jul. 2, 1999

(51) Int. Cl.⁷ ................................. H01L 21/8238
(52) U.S. Cl. ................. 438/199; 438/229; 438/230
(58) Field of Search ..................... 438/499, 200, 438/213, 216, 223, 224, 227, 228, 229, 230, 231, 232, 217, 302

(56) References Cited

U.S. PATENT DOCUMENTS

| 5,504,023 | 4/1996 | Hong ........................................ 437/44 |
| 5,668,024 | 9/1997 | Tsai et al. ............................. 438/199 |
| 5,670,423 | 9/1997 | Yoo ........................................ 437/192 |
| 5,759,901 | * 6/1998 | Loh et al. ............................. 438/305 |
| 5,827,747 | * 10/1998 | Wang et al. ......................... 438/199 |

* cited by examiner

Primary Examiner—David Nelms
Assistant Examiner—David Vu
(74) Attorney, Agent, or Firm—George O. Saile; Stephen B. Ackerman

(57) ABSTRACT

The invention provides a gate pocket implantation and post-processing sequence that allows for the creation of a deep and narrow pocket implant without affecting gate threshold voltage and the integrity of the gate oxide layer.

25 Claims, 4 Drawing Sheets

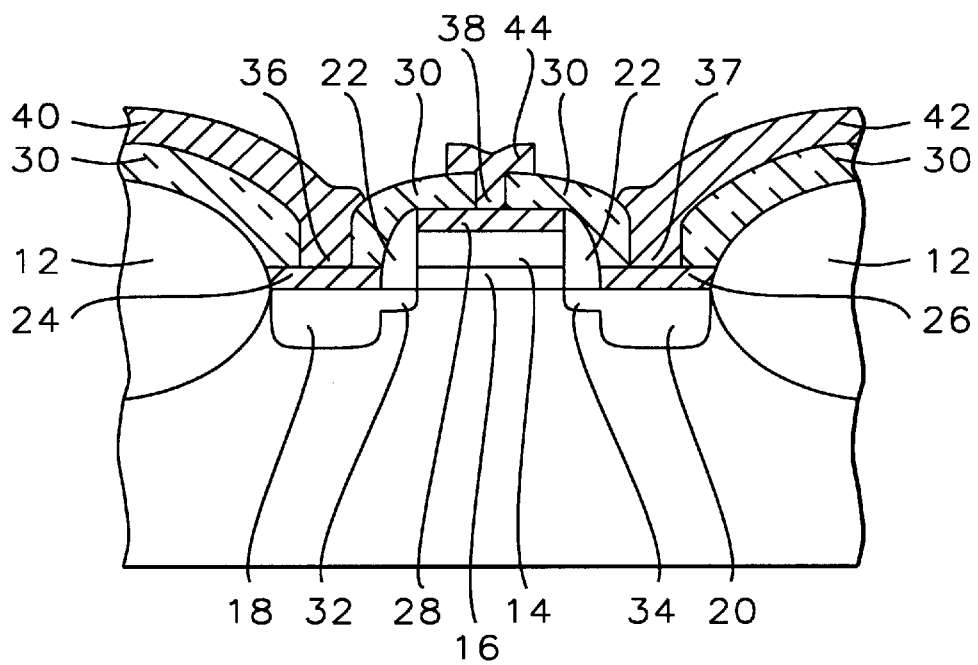
FIG. 1 — Prior Art
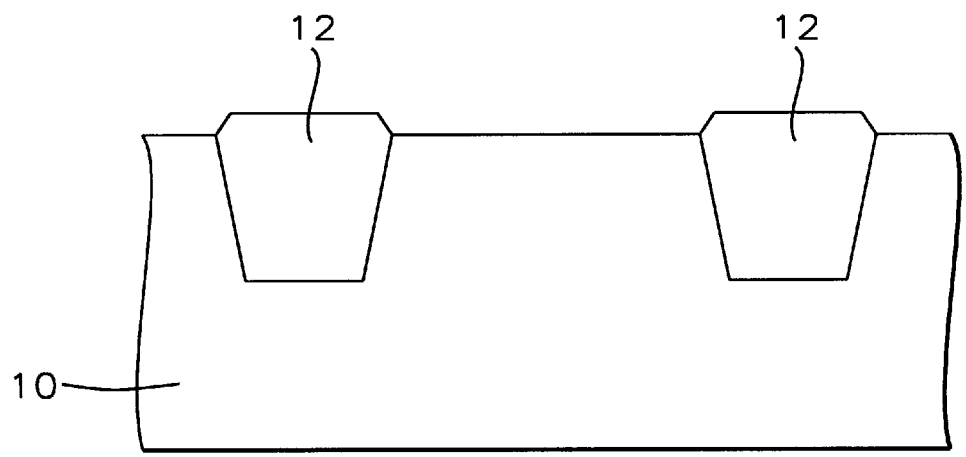
FIG. 2

INTEGRATION METHOD FOR DEEP SUB-MICRON DUAL GATE TRANSISTOR DESIGN

BACKGROUND OF THE INVENTION (1) Field of the Invention

The invention relates to the fabrication of integrated circuit devices, and more particularly, to a new method or sequence for the pocket implantation of deep sub-micron dual gate transistors.

(2) Description of the Prior Art

The continuing trend in the semiconductor industry is for smaller and faster devices that are created at constant or lower cost. These devices can essentially be broken down in bipolar devices and Metal Oxide Semiconductor Field Effect Transistor (MOSFET) devices where the latter category forms an increasing percentage of the total number of devices that are used in Integrated Circuit (IC) applications. It is projected that by the year 2000 the MOSFET devices will constitute roughly 90% of the overall market whereas the bipolar devices will be used for the remaining 10% of the applications. With reductions in device size is required a reduction in device power consumption which imposes the requirement of decreased device feature lengths. As a general rule can it be stated that device speed varies inversely with device feature length while power consumption increases approximately with the square of the device feature length. Feature size currently being approached is in the micron and sub-micron or 0.5 um range where it is not considered impossible that the feature size of 0.2 um will become a reality in the near future.

Field Effect Transistors (FET's) are at this time used extensively in Ultra Large-Scale Integration (ULSI) applications. FET's are formed using gate electrodes, usually made of polysilicon, and adjacent source/drain regions to which self-aligned source/drain contact areas are established. In its basic form, a Metal Oxide Semiconductor (MOS) transistor has a gate electrode to which a voltage is applied. The gate is created on the surface of a silicon substrate; the voltage that is applied to the gate creates an electric field that is perpendicular to the interface between the gate electrode and the substrate. The areas in the substrate immediately adjacent to the gate electrode are doped thereby varying their electric conductivity. The areas become the source/drain regions. By varying the voltage that is applied to the gate electrode, the electric field in the gate to substrate interface can be varied and, with that, the current that flows between the source and the drain regions. The electric field therefore controls the flow of current through the device; the device is therefore referred to as the Field Effect Transistor.

The type of device that is created and the type of areas that are created in conjunction with the device are to a large extent determined by the type of dopant that is used and the processing conditions under which the dopants are applied. The creation of semiconductor devices starts with a substrate, which is any material that can retain dopant ions, and the isolated conductivity regions brought about by those ions. Typically, a substrate is a silicon-based material, which receives p-type or n-type ions. The device feature that is being created dictates the type of doping and doping conditions. For instance boron or phosphorous can be used as a dopant and can be doped into polysilicon layers or within polycide gate electrodes.

Channel stop dopants can be p-type or n-type; implants can contain a p-type dopant such as boron implanted at a dose of $5 \times 10^{13}$ atoms/cm$^2$ at an energy of 35 keV. An n-type dopant is $P_{31}$ at a dose in the order of $2.8 \times 10^{12}$ atoms/cm$^2$ at energy of 60 keV.

A typical conductivity imparting dopant, used to create a lightly doped source and drain region, is phosphorous, ion implanted at an energy between about 5 to 100 KeV, at a dose between about 1E11 to 1E14 atoms/cm$^2$. A medium doped source and drain region can be created by using arsenic or phosphorous, ion implanted at an energy between about 5 to 50 KeV, at a dose between about 1E12 to 5E14 atoms/cm$^2$. A heavily doped source and drain region can be created by using arsenic, ion implanted at an energy between about 5 to 150 KeV, at a dose between about 1E15 to 1E16 atoms/cm$^2$.

Dual gate transistor design is the design where both NMOS and PMOS devices are created on the same chip. Earlier designs of Metal Oxide Semiconductor (MOS) devices primarily used PMOS design because only with p-channel devices using n$^+$-doped polysilicon gates and uniform lightly doped n-substrates could acceptable values for $V_t$ be attained. In its early history, the CMOS transistor was considered to be only an extension of the design for MOS IC's. Later advancements in fabrication technology, mostly due to improvements in ion implant techniques, allowed for the PMOS devices to be replaced with NMOS devices. The larger drive current of NMOS devices resulting in faster speed of these devices resulted in NMOS devices becoming the dominant device type in the IC industry. NMOS devices however exhibited severe limitations in power density and power dissipation causing CMOS devices to become the dominant technology for IC device manufacturing. With the arrival of CMOS devices, a renewed interest in PMOS device developed. CMOS employs both NMOS and PMOS devices to form logic elements. The advantage of CMOS is that its logic devices draw significant current only during the transition from one logic state to the other while drawing very little current between this transition.

The scaling of the CMOS devices in the sub-micrometer device range presents a major challenge. For the fabrication of p-channel and n-channel devices, n$^+$ doped polysilicon gates are used resulting in functional asymmetry. A number of techniques have been used to assure that the p-channel and n-channel devices are completely symmetrical in their performance characteristics such as threshold voltages, device dimensions and doping while the p-channel device is, for ease of manufacturing, a surface channel device. These devices are made using undoped polysilicon for the gate structures that are simultaneously doped at the time that the source/drain regions of each type of device are implanted. This leads to special manufacturing problems caused by, among others, diffusion of impurity implants through the gate oxide into the channel region thereby changing the threshold voltage of the device. Another concern in creating dual-gate CMOS devices is that various dopants may inter-diffuse between adjacent regions, an effect that can become critical at high anneal and other processing temperatures.

Increased CMOS device speed however requires short channel length, the design of p-channel devices with short channel length presents unique problems mostly centered on methods of doping and pocket implants for the device and the impact that these methods have on PMOS device characteristics. A technique used for instance to create deeper and narrower implant is to increase implant energy and implant dosage. This approach however may negate the self-alignment aspect of the implants where the gate electrode serves as a shield and the implants become in this way aligned around the gate electrode. The high implant energy and dosage may result in implant penetration through the gate electrode thereby affecting the gate threshold voltage performance while the high implant may affect the thin layer of gate oxide underlying the gate electrode. It is therefore critical to design an implant method and sequence where gate penetration by implant dopants is not a factor.

Various types of implants are used in the industry to create semiconductor devices. Implants can be a well implant that provides a more uniform background doping. A punch-through implant provides a channel with greater robustness to punch-through voltage. A thresh-hold implant sets the thresh-hold voltage of a device (like an IGFET). The well implant can be provided by boron at a dose in the range of $1 \times 10^{12}$ to $1 \times 10^{13}$ atoms/cm$^2$ and an energy in the range of 100 to 170 kilo-electron volts, a punch-through implant can be provided by boron at an dose in the range of $1 \times 10^2$ to $1 \times 10^{13}$ atoms/cm$^2$ and an energy in the range of 40 to 100 kilo electron volts, the thresh-hold implant can be provided by boron at a dose in the range $1 \times 10^{12}$ to $1 \times 10^{13}$ atoms/cm$^2$ and an energy in the range of 2 to 30 kilo electron volts. A channel implant can have a boron concentration on the order of $1 \times 10^{17}$ atoms/cm$^2$. Implants can also use arsenic; this can form an n-doped region. A heavy doped implant for instance is $3-5 \times 10^{15}$/cm$^2$ of arsenic at 50–80 keV.

FIG. 1 gives an overview of the self-aligned source, drain and gate salicide formation. This process starts with the surface of a semiconductor substrate 10, FIG. 1. Forming insulation regions that bound the active region isolates the active region that is to be used for the creation of, for instance, a gate electrode. Field Oxide (FOX) isolation regions 12 can be used to electrically isolate the discrete devices, such as Field Effect Transistors (FET's) in ULSI circuits on semiconductor chips formed from silicon substrate. One conventional approach in the semiconductor industry for forming field isolation is by the Local Oxidation of Silicon (LOCOS) method. LOCOS uses a patterned silicon nitride ($Si_3N_4$) as an oxidation barrier mask, the silicon substrate is selectively oxidized to form the semiplanar isolation. However, this method requires long oxidation times (thermal budget) and lateral oxidation under the barrier mask limits the minimum spacing between adjacent active device areas, and therefore prevents further increase in device packaging density.

One method of circumventing the LOCOS limitations and to further reduce the field oxide (FOX) minimum features size is to allow shallow trench isolation (STI). One method of making STI is to first etch trenches having essentially vertical sidewalls in the silicon substrate. The trenches are then filled with a CVD of silicon oxide ($SiO_2$) and the $SiO_2$ is then plasma etched back or polished back using CMP, to form the FOX isolation region. These regions are indicated as regions 12 in FIG. 1.

A thin layer of gate oxide is grown over the surface of the substrate 10 on the active device region. To create the gate structure, a layer of polysilicon is grown over the thin layer of gate oxide. The polysilicon layer is masked and the exposed polysilicon and the thin layer of oxide are etched to create the polysilicon gate 14 that is separated from the substrate by the remaining thin layer of oxide 16. The doping of the source/drain regions starts with creating the lightly N$^+$ doped diffusion (LDD) regions 32/34. The sidewall spacers 22 for the gate structure are formed after which the source and drain region doping is completed by doping the source/drain regions 18/20 to the desired level of conductivity using a N$^+$ dopant.

Contact points to the source/drain regions and the electrode gate are then formed by first selectively depositing a layer of titanium over the surface of the source/drain regions and the top surface of the gate electrode. This titanium is annealed causing the deposited titanium to react with the underlying silicon of the source/gain regions and the doped surface of the gate electrode. This anneal forms layers of titanium silicide 24/26 on the surfaces of the source/drain regions and layer 28 on the top surface of the gate electrode.

The metal contacts with the source/drain regions and the gate electrode are formed as a final step. A dielectric 30 such as silicon oxide is blanket deposited over the surface of the created structure, patterned and etched to create contact openings 36/37 over the source/drain regions and opening 38 over the top surface of the gate electrode. The metalization layer selectively deposited over the patterned dielectric establishes the electrical contacts 40/42 with the source/drain regions and 44 with the top surface of the gate electrode.

The above indicated process results in contact openings that are relatively wide since these contact openings must be wide enough for the applied photolithography processes. The process of annealing also uses the underlying silicon during the salicidation process, this process is difficult to control making control of uniform source/drain junction depth difficult to achieve while underlying dopant may also be depleted. The heavy doping required to establish the desired conductivity for the source/drain regions might also result in out diffusion under the gate region thereby reducing the effective channel length for the electrode gate.

One of the key factors that affect the reliability of FET device of small geometry result from the shrinkage of channel length and channel width. To overcome the problems associate with short and narrow channel effects is therefore an important concern in the design of FET devices. Gate oxide integrity can also be negatively affected by the hot-carrier effect. If the carriers can acquire sufficient energy from the lateral electric field (the field parallel to the plane of the substrate surface), these carriers may transfer across the substrate to the gate oxide interface thereby affecting the oxide conduction band and, ultimately, its function of forming a gate oxide layer of electrical separation. The electric field barrier for electron injection is smaller than it is for hole injection. This problem is therefore more prominent in n-channel MOSFET's because electrons form the charge carrier in the device channel.

For device features below the 0.5 um range (deep submicron), thinner polysilicon is required for the gate electrode. A relatively thick layer of polysilicon when used for the electrode gate structure results in poly depletion and a larger effective time required for the oxidation process of the gate electrode which results in lower drain saturation current and a higher threshold voltage for the gate electrode. By limiting the thickness of the layer of polysilicon, the energy that can be used to perform the pocket implants must be reduced resulting in shallow implants.

Because of these processing issues, the application of the various implants requires considerable process development and in some instances new processes have to be used. Using conventional processing techniques to create deep and well-defined pocket implants, the implant energy and implant dosage cannot be increased. A high-energy pocket implant may result in penetration of the implant though the polysilicon of the gate electrode thereby affecting the threshold voltage of the device. High dopant concentration will degrade the quality of the thin layer of gate oxide underlying the gate polysilicon. The invention modifies the conventional implant and subsequent processing steps thereby in effect creating an improved pocket implant.

Prior Art processing flow sequence that is of interest for the invention for the deep sub-micron dual gate electrode creation is as follows:

Provide a semiconductor substrate;

Form STI regions;

Implant Channel region;

Form the poly gate pattern;

Remove the hard mask SiON layer;

Reoxidate the polysilicon gate surface;

Implant the PMOS pocket;

Implant the NMOS pocket;
Implant NLDD;
Implant PLDD;
RTA the LDD's;
Form the gate spacers;
N+ source/drain implant;
RTA of N+ source/drain;
P+ source/drain implant;
RTA of P+ source/drain;
Deposit ILD; and
CMP of ILD.

The sequence as indicated above will be modified for the purpose of meeting the below stated objectives of the invention, this as follows: the sub-sequence taken from the Prior Art sequence indicated above as:

Remove the hard mask SiON layer;
Reoxidate the polysilicon gate surface;
Implant the PMOS pocket;
Implant the NMOS pocket; and
Implant NLDD will be replaced by the new sequence of:

Implant the PMOS pocket;
Implant the NMOS pocket;
Implant NLDD;
Remove the hard mask SiON layer; and
Reoxidate the polysilicon gate surface.

The balance of the above-indicated Prior Art processing sequence will remain unmodified.

U.S. Pat. No. 5,670,423 (Yoo) divulges a hardmask and etch process for a gate.

U.S. Pat. No. 5,668,024 (Tsai et al.) and U.S. Pat. No. 5,504,023 (Hong) recite pocket I/I processes.

U.S. Pat. No. 5,759,901 (Loh et al.) shows a FET with multiple I/I's.

SUMMARY OF THE INVENTION

It is the primary objective of the invention to improve FET device performance.

It is another objective of the invention to improve the integrity of the gate oxide layer.

It is a further objective of the invention to allow for deep and narrow pocket implant without affecting the threshold voltage of the FET gate electrode.

In accordance with the objectives of the invention, the invention provides a gate pocket implantation and post-processing sequence that allows for the creation of a deep and narrow pocket implant without affecting gate threshold voltage and the integrity of the gate oxide layer.

BRIEF DESCRIPTION OF THE DRAWINGS

FIG. 1 shows a cross section of a Prior Art FET gate electrode.

FIG. 2 shows a cross section of the formation of Shallow Trench Isolation (STI) regions for the gate electrode.

DESCRIPTION OF THE PREFERRED EMBODIMENTS

Referring now specifically to FIG. 2, there is shown a cross section of a silicon substrate 10 in which STI's 12 have been created. STI's can be made using a variety of methods. For instance, one method is the Buried Oxide (BOX) isolation used for shallow trenches. The method involves filling the trenches with a chemical vapor deposition (CVD) of silicon oxide ($SiO_2$) and performing an etchback or mechanically/chemically polish of the $SiO_2$ to yield a planar surface. The shallow trenches etched for the BOX process are anisotropically plasma etched into the silicon substrate and are typically between 0.5 and 0.8 micrometer (um.) deep. STI's are formed around the active device region to a depth between 4000 and 20000-Angstrom.

It is desirable to make BOX areas that extend higher than the substrate surface to avoid etching of the silicon oxide to the substrate surface which results in dishing of the surface of the CVD silicon oxide in the trenches. This results in recesses in the field oxide at the edge of the device areas. Later, when the gate electrodes are made for the FET's extending over the device area edge, this results in an undesirable lower and variable threshold voltage when the devices are completed.

Figure 3:
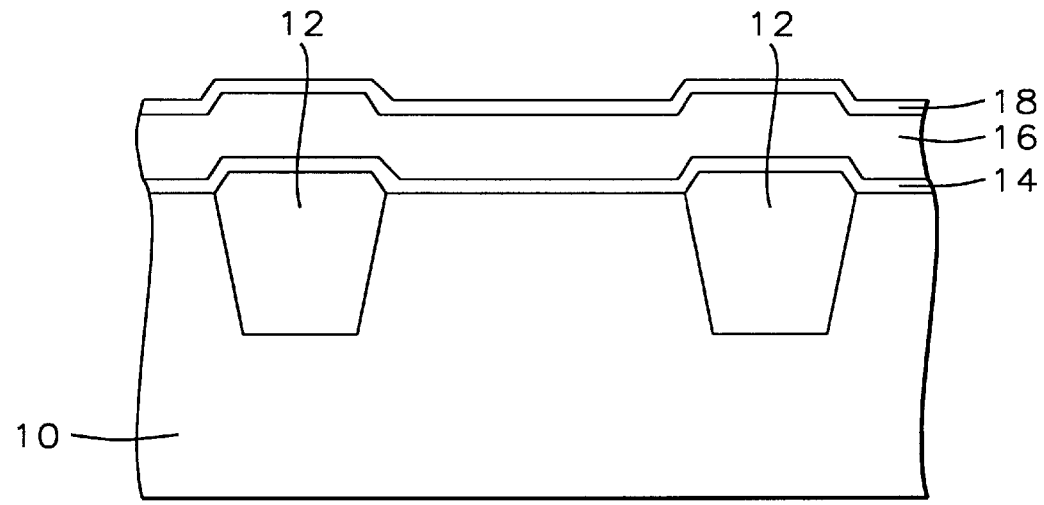
FIG. 3 shows a cross section of the deposition of a layer of gate oxide, a layer of polysilicon and a layer of SiON.

FIG. 3 shows the deposition of a layer of gate oxide 14 over which a layer 16 of polysilicon for the gate electrode is deposited. A final layer 18 of SiON is deposited on the surface of the polysilicon layer 16.

Gate oxide is usually formed as a silicon dioxide material but may be a composite oxide, such as TEOS and silicon dioxide, or a nitride oxide layer or a like gate dielectric. The gate oxide can be silicon dioxide, thermally grown in an oxygen-steam ambient at a temperature between 800 and 1000 degrees C. to a thickness of about 30 to 300 Angstrom.

The lower part (the conductive part) of a gate electrode typically is either polysilicon or amorphous silicon or a combination of both. This layer may be in-situ doped with dopant atoms or ion implanted with dopant atoms to alter the conductivity pattern of this conductive layer.

The polysilicon layer can be deposited using LPCVD processing, at a temperature of about 500 to 650 degrees C. to a thickness between about 2000 to 4000 Angstrom.

The layer 18 of Silicon-oxynitride (SiON) can be PECVD deposited and can contain mixtures of $SiH_4$, $NH_3$, $N_2$ and $N_2O$. This layer serves as a passivation layer. This layer of SiON typically can contain considerably less $H_2$ than PECVD nitrides while the layer provides a low-stress film. The characteristics of this layer of SiON can be tailored for optimum thermal stability, low stress and crack resistance. These films are also less permeable to moisture and the other deposited contaminants than oxide films.

Layer 18 of SiON forms a hard mask layer directly overlying the polysilicon layer 16. A layer 18 of SiON is sputter deposited over the layer 16 to a thickness of between 100 and 400 Angstrom. The hard semiconductor mask is opaque to the actinic light used in photolithography so that light will not be reflected from the polysilicon around the slope of the top of the gate electrode.

Figure 4:
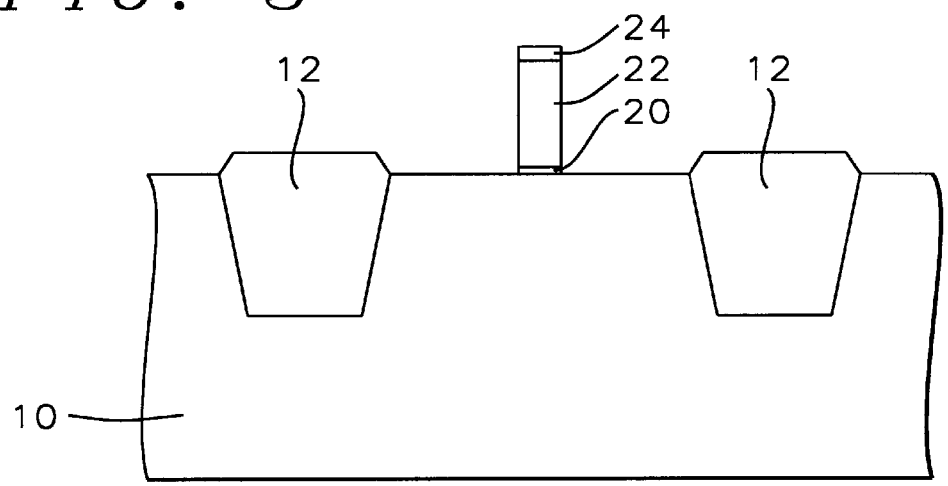
FIG. 4 shows a cross section of the creation of the gate electrode containing a layer of gate oxide, a layer of polysilicon and a layer of SiON.

FIG. 4 shows a cross section of the gate electrode after completion of the etching of the self-align gate pattern. The three layer gate structure is created be patterning and etching. Overlaying the hard mask layer 18 with a layer of photoresist (not shown) to a thickness of about 0.7 to 1.5 um creates the gate structure. The photoresist is exposed, developed and etched to form the pattern of the SiON mask 24. The hard mask layer 18, the poly layer 16 and the gate oxide layer 14 are etched away where not covered by the photoresist mask resulting in the stack of the gate electrode as shown in FIG. 4.

The photoresist mask is stripped using conventional methods such as oxygen ashing. The hard mask layer 16 is stripped using, for example, a solution of ammonia and hydrogen peroxide ($NH_4OH+H_2O_2$) with an etch rate of between about 300 to 900 Angstrom per minute.

The polysilicon gate structure can be created using anisotropic RIE of the polysilicon layer 16, using $Cl_2$ or $SF_6$ as an etchant and resulting in a polysilicon gate structure with a width between 1000 and 3500-Angstrom.

Figure 5:
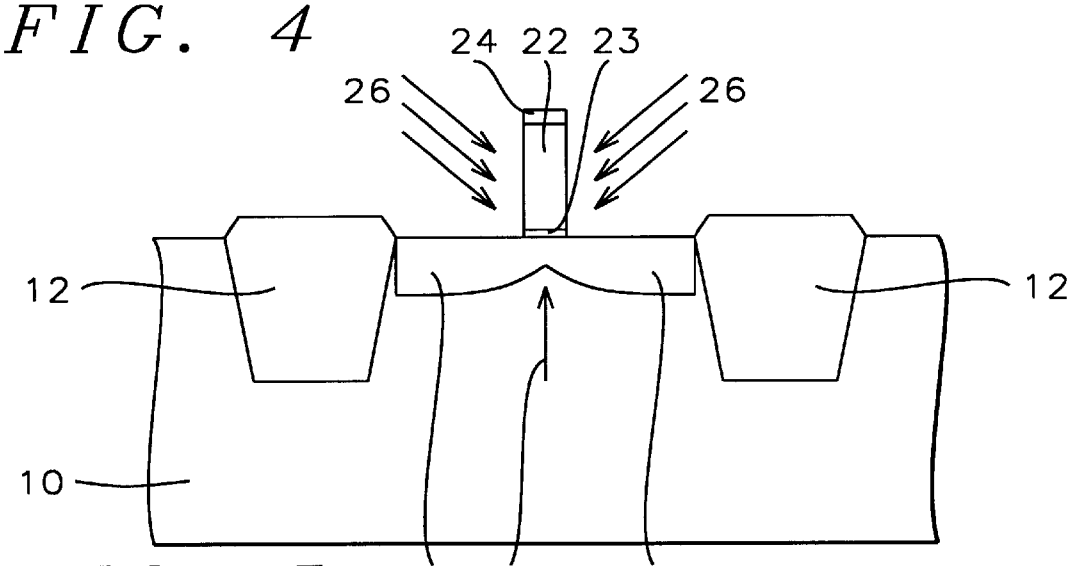
FIG. 5 shows a cross section of a high-energy pocket implant for a PMOS device.

FIG. 5 shows a cross section of the high-energy pocket implant 26 for the PMOS device; the implanted pockets are highlighted as regions 28. The indicated pocket implant 26 of regions 28 establishes a high punch through voltage for the gate electrode that results in a low off-state current of the gate electrode. It is to be noted that the pocket implant 26 is performed before the hard mask (layer 24) removal. This results in being able to use a thinned layer 22 of poly for the gate structure since the hard mask 24 has high stopping power during the pocket implant 26.

It must be noted in FIG. 5 that the pocket implant 26 creates implanted pockets 28 that overlap in region 32, that is the regions where the implanted pockets meet (and overlap). This overlapping region 32 further emphasizes that effect of typical pocket implants by further increasing the punch through voltage for the gate electrode resulting in a further reduction of the off-state current of the gate electrode.

Typical operating conditions for the pocket implant 26 are as follows:

```
For NMOS: In-energy: 50 to 250 keV
                -dose: 5e12 to 1e14 atoms/cm²
For PMOS: As-energy: 50 to 250 keV
                -dose: 5e12 to 1e14 atoms/cm²
```

The latter implant, that is the PMOS implant, is the implant that is being performed as shown in FIG. 5.

Figure 6:
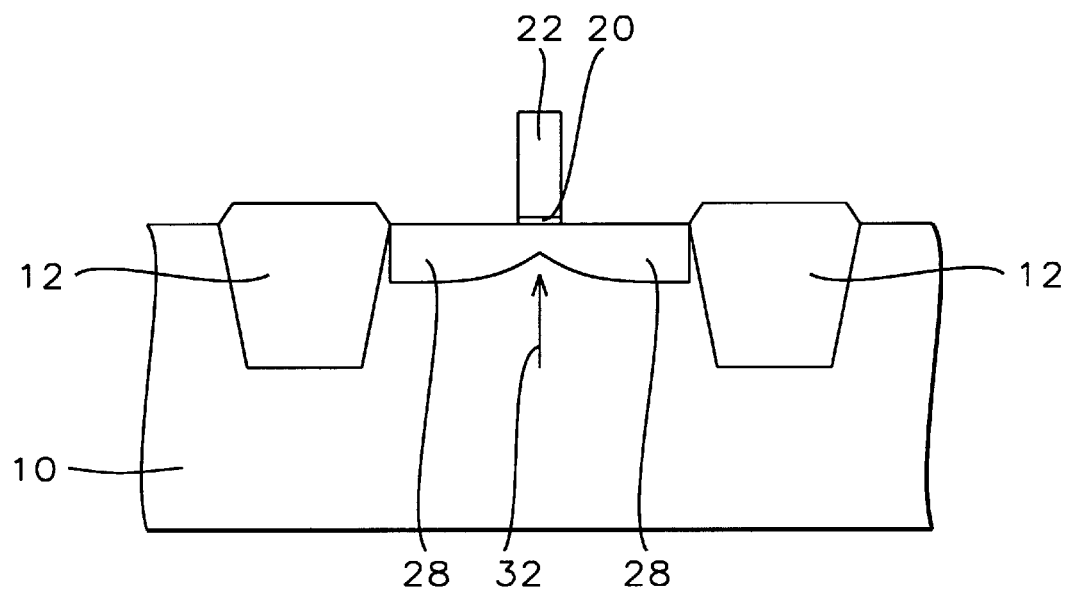
FIG. 6 shows a cross section after the removal of the top layer of SiON from the surface of the gate and the re-oxidation of this surface.

FIG. 6 shows the removal of the SiON hard mask layer 24 (FIG. 5) from the top surface of the gate electrode structure thereby exposing the top surface of layer 22 the poly of the gate, the surface of the poly is re-oxidized. The removal of layer 24 is an anisotropical etch using a solution of ammonium and hydrogen peroxide. The oxidation of the surface of the poly gate can be accomplished using Rapid Thermal Oxidation in a single wafer Rapid Thermal Processing chamber thereby growing a thin layer of about 30 angstrom of oxide on the surface of the poly.

It must be noted that the re-oxidation of the surface of the poly is performed after the pocket implant has been completed. This sequence helps to anneal the damage to the gate oxide incurred during the pocket implant.

Figure 7:
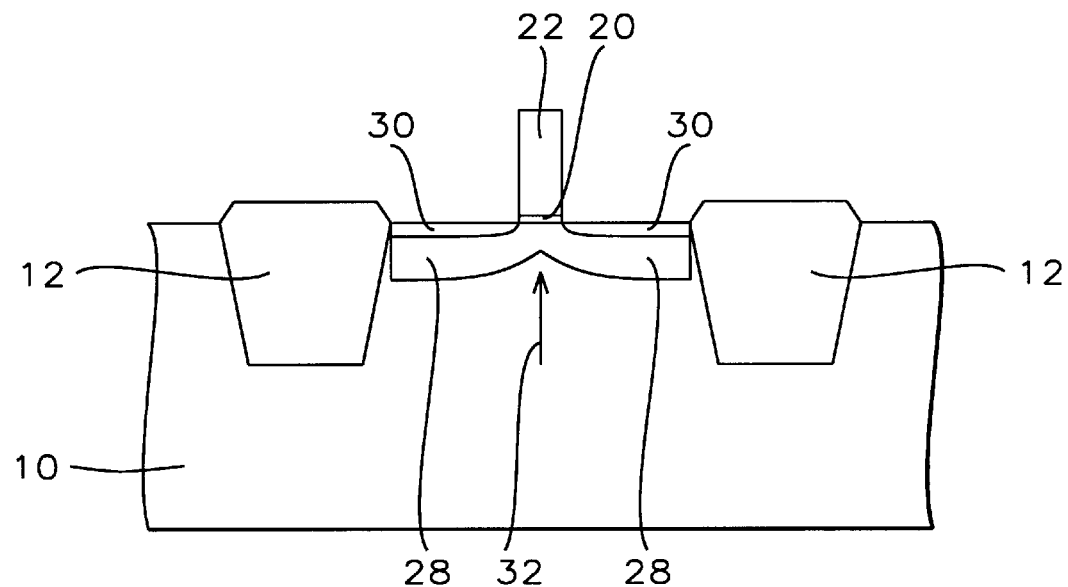
FIG. 7 shows a cross section of the PLDD implant.

FIG. 7 shows a cross section of the PLDD implant 30. Hot-carrier effects cause unacceptable performance degradation in CMOS devices that are built with conventional drain structures if their channel lengths are less than 2 um. To overcome this problem, Lightly Doped Drains (LDD) are used. The structures absorb some of the potential into the drain and thus reduce the maximum electric field $E_M$. In the LDD structure, the drain is formed by two implants. One of these is self-aligned to the gate electrode, and the other is self-aligned to the gate electrode on which two oxide sidewall spacers will be formed. The purpose of the lighter dose is to form a lightly doped section of the drain at the edge near the channel. The $E_M$ is reduced by this structure because the voltage drop is shared by the drain and the channel, this in contrast with a conventional drain structure in which almost all of the voltage drop occurs across the lightly doped channel region.

The LDD is typically performed as follows:

```
For NMOS: As-energy 1 to 10 keV
                -dose 1e14 to 1e16 atoms/cm²
For PMOS: BF₂-energy 1 to 10 keV
                -dose 1e14 to 5e15 atoms/cm².
```

The latter implant is the implant that is shown in FIG. 7.

Figure 8:
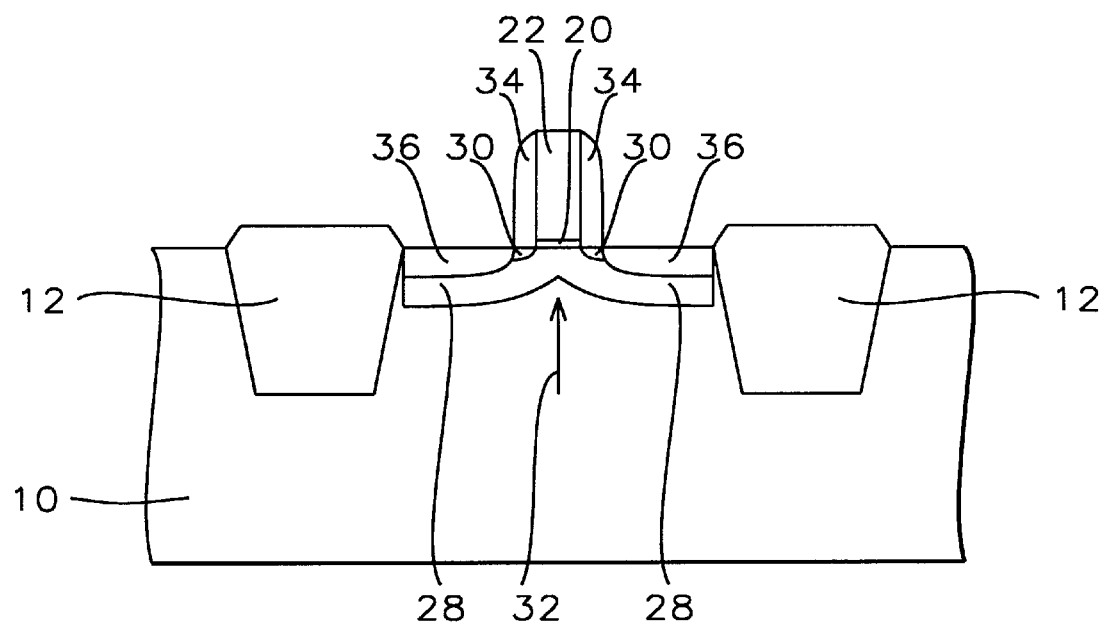
FIG. 8 shows a cross section of the gate electrode after the completion of the gate spacer formation and the $P^+$ implant.

FIG. 8 shows a cross section of the gate electrode after the completion of the gate spacers 34 formation and the $P^+$ implant 36. Typical gate spacer materials are silicon nitride, silicon oxide, BSG, PSG, polysilicon, other materials preferably of a dielectric nature, CVD oxide formed from a TEOS source. Often amorphous materials are used that inhibit the deposition of epitaxial silicon thereupon. Silicon oxide spacers can be formed via anisotropic RIE of the silicon oxide layer, using $CHF_3$ or $CF_4$—$O_2$—He as an etchant. Silicon nitride spacers can be formed via anisotropic RIE of the silicon nitride layer, using $CHF_3$ or $SF_6$—$O_2$ as an etchant. Spacers 34 can also be formed using thermal $S_iN$ or by CVD $S_iN$ or by thermal $SiO_xN_y$ or by CVD $SiO_xN_y$. Typical $P^+$ implants are performed as follows:

```
source boron-energy: 100 to 220 keV
            -dose: 1e13 to 1e14 atoms/cm²
source boron-energy: 5 to 40 keV
            -dose: 1e12 to 5e13 atoms/cm²
source indium-energy: 50 to 250 keV
            -dose: 1e12 to 1e14 atoms/cm².
```

It is clear that the invention can be applied to any type of MOS device, that is to both NMOS and PMOS devices. Also, where the above discussion has been illustrated with the use of a hard mask, the related processing steps can also be performed using conventional photoresist mask.

While the invention has been particularly shown and described with reference to the preferred embodiments thereof, it will be understood by those skilled in the art that various changes in form and details may be made without deviating from the spirit and scope of the invention.

What is claimed is:

1. A method of fabricating a CMOS device, on a semiconductor substrate, comprising the steps of:

forming isolation regions in said substrate thereby creating active regions within said substrate;

performing channel implantation in said active region;

forming a polysilicon gate pattern within said active region, said gate structure to include a hard mask as an upper layer, then;

performing a PMOS pocket implant, then;

performing a NMOS pocket implant wherein said NMOS pocket implant uses Indium with an energy of 50 to 250 keV and a dose of 5e12 to 1e14 atoms/cm², then;

performing a NLDD implant, then;

removing said hard mask layer thereby exposing said gate polysilicon, then;

reoxidating said gate polysilicon, then;

performing PLDD implant;

performing a Rapid Thermal Anneal of said NLDD and PLDD regions;

performing gate spacers;

forming source/drain regions N+ implant;

performing a Rapid Thermal Anneal of said source/drain regions N+ implant;

performing source/drain regions P+ implant; and performing a Rapid Thermal Anneal of said source/drain regions P+ implant.

2. The method of claim 1 wherein said forming a polysilicon gate pattern is:

depositing a layer of gate oxide over the surface of said substrate;

depositing a layer of polysilicon over said layer of gate oxide;

depositing a layer of SiON over said layer of polysilicon; and patterning and etching said layer of SiON including said layer of polysilicon further including said layer of gate oxide thereby creating a polysilicon gate structure.

3. The method of claim 2 wherein said gate oxide is formed using an element from the group of silicon dioxide or composite oxide or nitride oxide or a similar gate dielectric grown at a temperature of between about 800 to 1000 degrees C. and to a thickness of between 60 to 160 Angstrom.

4. The method of claim 2 wherein said polysilicon layer is deposited using LPCVD procedures at a temperature between about 500 and 600 degrees C. to a thickness between about 2000 and 4000 Angstrom.

5. The method of claim 2 wherein said layer of polysilicon is grown at a temperature between 600 and 640 degrees C. to a thickness of about 1000 and 3000 Angstrom.

6. The method of claim 2 wherein said layer of SiON is sputter deposited to a thickness of between about 100 and 400 Angstrom.

7. The method of claim 2 wherein said polysilicon gate structure is created via anisotropic RIE of said layers of SiON and polysilicon and gate oxide using $Cl_2$ or $SF_6$ as an etchant and resulting in said polysilicon gate structure with a width between about 100 and 3500 Angstrom.

8. The method of claim 1 wherein said PMOS pocket implant uses Arsenic with an energy of 50 to 250 keV and a dose of 5e12 to 1e14 atoms/$cm^2$.

9. The method of claim 1 wherein said PMOS implant uses $BF_2$ with an energy within the range of between 1 to 10 keV and a dose within the range of between 1e14 to 5e15 atoms/$cm^2$.

10. The method of claim 1 wherein removing said hard mask layer is an anisotropical etch using a solution of ammonium and hydrogen peroxide.

11. The method of claim 1 wherein said reoxidation of the surface of the poly gate is a Rapid Thermal Oxidation in a single wafer Rapid Thermal Processing chamber thereby growing a thin layer of about 30 angstrom of oxide on the surface of the poly.

12. A method of fabricating a MOS device, on a semiconductor substrate, comprising the steps of:

forming isolation regions in said semiconductor substrate thereby creating active regions within said substrate;

performing channel implantation in said active regions;

forming a polysilicon gate pattern within said active regions said gate pattern to include a hard mask or a photoresist mask as an upper level, then;

performing a tilt angle pocket implant, then;

performing a LDD implant, then;

removing said hard mask or said photoresist mask layer thereby exposing said gate polysilicon, then;

reoxidating said polysilicon, then;

forming gate spacers; and performing source/drain implant.

13. The method of claim 12 wherein said hard mask is an anti reflective coating (ARC) layer.

14. The method of claim 12 wherein said mask is oxynitride (SiON).

15. The method of claim 12 wherein said forming a polysilicon gate pattern is:

depositing a layer of gate oxide over the surface of said substrate;

depositing a layer of polysilicon over said layer of gate oxide;

depositing a layer of SiON over said layer of polysilicon; and patterning and etching said layer of SiON including said layer of polysilicon further including said layer of gate oxide thereby creating a polysilicon gate structure.

16. The method of claim 15 wherein said gate oxide is formed using an element from the group of silicon dioxide or composite oxide or nitride oxide or a similar gate dielectric grown at a temperature of between about 800 to 1000 degrees C. and to a thickness of between 60 to 160 Angstrom.

17. The method of claim 15 wherein said polysilicon layer is deposited using LPCVD procedures at a temperature between about 500 and 600 degrees C. to a thickness between about 2000 and 4000 Angstrom.

18. The method of claim 15 wherein said layer of polysilicon is grown at a temperature between 600 and 640 degrees C. to a thickness of about 1000 and 3000 Angstrom and is in-situ doped with phosphine to a concentration between about 1E20 to 1E21 atoms/$cm^2$.

19. The method of claim 15 wherein said layer of SiON is sputter deposited to a thickness of between about 100 and 400 Angstrom.

20. The method of claim 15 wherein said polysilicon gate structure is created via anisotropic RIE of said layers of SiON and polysilicon and gate oxide using $Cl_2$ or $SF_6$ as an etchant and resulting in said polysilicon gate structure with a width between about 100 and 3500 Angstrom.

21. The method of claim 12 wherein said tilt angle pocket implant uses Arsenic with an energy of 50 to 250 keV and a dose of 5e12 to 1e14 atoms/$cm^2$.

22. The method of claim 12 wherein said tilt angle pocket implant uses $BF_2$ with an energy within the range of between 1 to 10 keV and a dose within the range of between 1e14 to 5e15 atoms/$cm^2$.

23. The method of claim 12 wherein said tilt angle pocket implant uses Indium with an energy of 50 to 250 keV and a dose of 5e12 to 1e14 atoms/$cm^2$.

24. The method of claim 12 wherein removing said hard mask layer is an anisotropical etch using a solution of ammonium and hydrogen peroxide.

25. The method of claim 12 wherein said reoxidation of the surface of the poly gate is a Rapid Thermal Oxidation in a single wafer Rapid Thermal Processing chamber thereby growing a thin layer of about 30 angstrom of oxide on the surface of the poly.

* * * * *